(12) United States Patent
Tsen et al.

(10) Patent No.: US 11,588,482 B1
(45) Date of Patent: Feb. 21, 2023

(54) MULTIPLEXING SAMPLE-AND-HOLD CIRCUIT

(71) Applicant: HRL Laboratories, LLC, Malibu, CA (US)

(72) Inventors: Chan-Tang Tsen, Thousand Oaks, CA (US); Donald Hitko, Olney, MD (US); Susan Morton, Pittsford, NY (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/516,582

(22) Filed: Nov. 1, 2021

Related U.S. Application Data (60) Provisional application No. 63/116,012, filed on Nov. 19, 2020.

(51) Int. Cl.
| | | |
|---|---|---|
| *H03K 17/687* | (2006.01) | |
| *H03K 19/20* | (2006.01) | |
| *H03F 3/45* | (2006.01) | |

(52) U.S. Cl.
CPC ..... *H03K 17/6871* (2013.01); *H03F 3/45475* (2013.01); *H03K 19/20* (2013.01)

(58) Field of Classification Search
CPC ................ H03K 17/6871; H03K 19/20; H03F 3/45475
See application file for complete search history.

(56) References Cited

U.S. PATENT DOCUMENTS

| | | | | |
|---|---|---|---|---|
| 5,389,833 A | | 2/1995 | Kay | |
| 8,111,094 B2* | | 2/2012 | Fischer | G11C 27/026 327/407 |
| 8,378,717 B1* | | 2/2013 | Tsai | G11C 27/026 327/95 |
| 2009/0256060 A1* | | 10/2009 | Meynants | H01L 27/14612 250/214 A |
| 2011/0002062 A1* | | 1/2011 | Fischer | G11C 27/02 360/67 |
| 2016/0104543 A1* | | 4/2016 | Powell | G11C 27/026 327/96 |

OTHER PUBLICATIONS

Ishida, K. et al., "Managing Subthreshold Leakage in Charge-Based Analog Circuits With Low-$V_{TH}$ Transistors by Analog T-Switch (AT-Switch) and Super Cut-off CMOS (SCCMOS)", IEEE Journal of Solid-State Circuits, Apr. 2006, pp. 859-867, vol. 41, No. 4, IEEE.

(Continued)

*Primary Examiner* — Metasebia T Retebo
(74) *Attorney, Agent, or Firm* — Lewis Roca Rothgerber Christie LLP (57) ABSTRACT

A signal processing circuit. In some embodiments, the signal processing circuit includes a first sample and hold circuit and a second sample and hold circuit. The first sample and hold circuit may include: a hold capacitor; an input switch connected between a common input node and the hold capacitor; a signal path amplifier having an input connected to the hold capacitor; and an output switch connected between an output of the signal path amplifier and a common output node. An input of a voltage feedback amplifier may be connected to the hold capacitor, and an output of the voltage feedback amplifier may be operatively coupled to an internal node of the input switch.

19 Claims, 6 Drawing Sheets

(56) References Cited

OTHER PUBLICATIONS

O'Halloran, M. et al., "A 10-nW 12-bit Accurate Analog Storage Cell With 10-aA Leakage", IEEE Journal of Solid-State Circuits, Nov. 2004, pp. 1985-1996, vol. 39, No. 11, IEEE.

Roy, K. et al., "Leakage Current Mechanisms and Leakage Reduction Techniques in Deep-Submicrometer CMOS Circuits", Proceedings of the IEEE, Feb. 2003, vol. 91, No. 2, pp. 305-327, IEEE.

\* cited by examiner

Select 1.1 enables the switch to load Channel 1 with voltage level 1

Select 1.2 enables the switch to load Channel 2 with voltage level 2

The data is held on each channel for a variable time

When Select 3 is high, the output switch is closed and:

A high value for Select 2.1 will enable the switch connecting Channel 1 to the output     A high value for Select 2.2 will enable the switch connecting Channel 2 to the output

MULTIPLEXING SAMPLE-AND-HOLD CIRCUIT

CROSS-REFERENCE TO RELATED APPLICATION(S)

The present application claims priority to and the benefit of U.S. Provisional Application No. 63/116,012, filed Nov. 19, 2020, entitled "MULTIPLEXING SAMPLE-AND-HOLD-ARCHITECTURE", the entire content of which is incorporated herein by reference.

GOVERNMENT LICENSE RIGHTS

This invention was made with U.S. Government support. The U.S. Government has certain rights in this invention.

FIELD

One or more aspects of embodiments according to the present disclosure relate to signal processing circuits, and more particularly to a sample and hold circuit.

BACKGROUND

Sample and hold circuits have broad applicability, and, for example, a sample and hold circuit may be employed in a signal processing circuit to drive a sensor or to drive an analog to digital converter. A sample and hold circuit may include a hold capacitor that is connected, through an input switch, to a digital or analog input, and charged, during a sampling interval, to the voltage at the input. During a subsequent hold interval, the input switch may be opened, causing the capacitor to be disconnected from the analog input. During the hold interval, the voltage on the hold capacitor may be used to drive a sensor or a subsequent stage of a larger circuit or it may be measured, e.g., converted from an analog to a digital signal by an analog to digital converter. A change in the charge on the hold capacitor during the hold interval, for example due to leakage through the input switch, may be an important source of error in such a circuit. In applications where a signal must be held for long periods of time at high precision, this leakage is significant and needs to be minimized.

Thus, there is a need for an improved signal processing circuit.

SUMMARY

According to an embodiment of the present invention, there is provided a signal processing circuit, including: a first sample and hold circuit; and a second sample and hold circuit, the first sample and hold circuit including: a hold capacitor; an input switch connected between a common input node and the hold capacitor; a signal path amplifier having an input connected to the hold capacitor; and an output switch connected between an output of the signal path amplifier and a common output node, an input of a voltage feedback amplifier being connected to the hold capacitor, and an output of the voltage feedback amplifier being operatively coupled to an internal node of the input switch.

In some embodiments, the voltage feedback amplifier is the signal path amplifier.

In some embodiments, the voltage feedback amplifier is a switch feedback amplifier, separate from the signal path amplifier.

In some embodiments, the operative coupling of the voltage feedback amplifier and the internal node of the input switch is configured to increase the effective resistance of the input switch by a factor of at least 100.

In some embodiments, the effective resistance of the input switch is greater than 100,000 ohms.

In some embodiments, the input switch includes: a first series switch; a second series switch; and a voltage feedback switch, the first series switch being connected between the common input node and the internal node, the second series switch being connected between the internal node and the hold capacitor, and the voltage feedback switch being connected between the output of the voltage feedback amplifier and the internal node.

In some embodiments, the first series switch includes a first transistor connected in parallel with a second transistor.

In some embodiments, the first transistor is an n-channel field effect transistor, and the second transistor is a p-channel field effect transistor.

In some embodiments, the second series switch includes an n-channel field effect transistor connected in parallel with a p-channel field effect transistor.

In some embodiments, the signal processing circuit further includes a clock circuit having an input, a first output and a second output, the clock circuit being configured to receive a reference clock signal and to produce: at the first output, a first clock signal having the same frequency as the reference clock signal, at the second output, a second clock signal having the same frequency as the reference clock signal, the first output being operatively coupled to one or more control terminals of the first series switch and of the second series switch, the second output being operatively coupled to the voltage feedback switch.

In some embodiments, the clock circuit is configured to cause, in order: the first series switch and the second series switch to open; the voltage feedback switch to close; the voltage feedback switch to open; and the first series switch and the second series switch to close.

In some embodiments: the first series switch includes a first field effect transistor connected in parallel with a second field effect transistor; the second series switch includes a first field effect transistor connected in parallel with a second field effect transistor; and the first output of the clock circuit is connected: through a first inverter and a second inverter, connected in cascade, to: the gate of the first field effect transistor of the first series switch, and the gate of the first field effect transistor of the second series switch; and through a third inverter to: the gate of the second field effect transistor of the first series switch, and the gate of the second field effect transistor of the second series switch.

In some embodiments, each of the second inverter and the third inverter is connected to a respective bandwidth-limiting circuit.

In some embodiments, each of the bandwidth-limiting circuits limits the bandwidth of a corresponding inverter to a respective bandwidth, each of the respective bandwidths being less than 10 GHz or less than a frequency of a system clock signal.

In some embodiments: the voltage feedback switch includes a first field effect transistor connected in parallel with a second field effect transistor; and the second output of the clock circuit is connected: to the gate of the first field effect transistor of the voltage feedback switch, and through one inverter, to the gate of the second field effect transistor of the voltage feedback switch.

In some embodiments: the second sample and hold circuit includes: a hold capacitor, an input switch connected between the common input node and the hold capacitor of the second sample and hold circuit, a signal path amplifier having an input connected to the hold capacitor of the second sample and hold circuit, an output switch connected between an output of the signal path amplifier of the second sample and hold circuit and the common output node; and the output of the signal path amplifier of the second sample and hold circuit is operatively coupled to an internal node of the input switch of the second sample and hold circuit.

In some embodiments, the signal path amplifier includes a source follower amplifier.

In some embodiments, the signal path amplifier includes a differential amplifier.

In some embodiments, the signal processing circuit further includes an output stage, having an input connected to the common output node.

In some embodiments, the output stage includes a source follower amplifier.

In some embodiments, the output stage includes a differential amplifier.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a multiplexing sample-and-hold circuit provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1A:
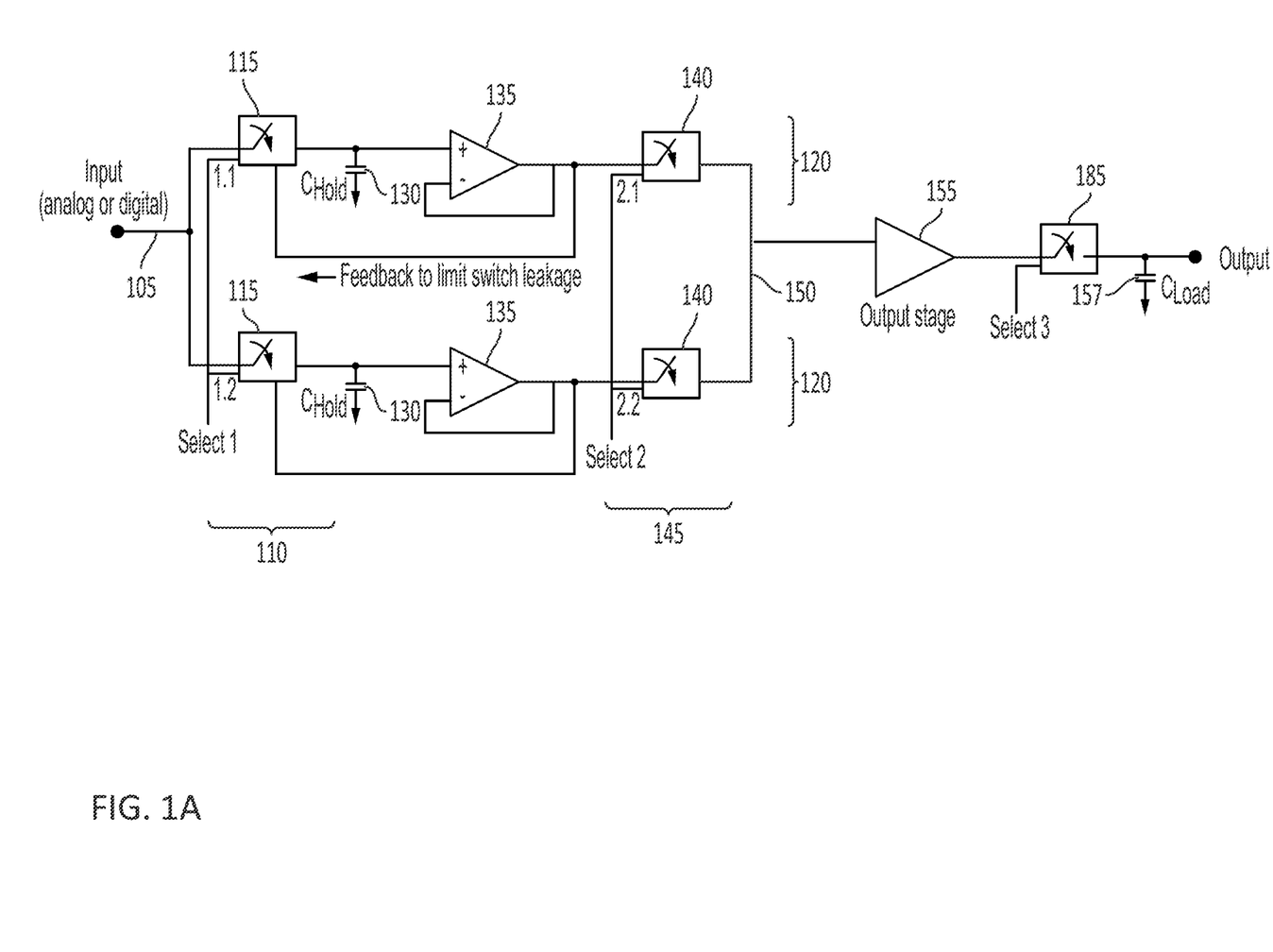
FIG. 1A is a schematic diagram of a portion of a signal processing circuit, according to an embodiment of the present disclosure.

FIG. 1A is a schematic diagram, in some embodiments, of a signal processing circuit which operates as a multiplexing sample-and-hold circuit. An analog or digital signal is received at a common input node 105. An input demultiplexer 110, including (e.g., consisting of) a plurality of input switches 115, each of which may be part of a corresponding sample-and-hold circuit 120, routes the signal to one of a plurality of sample-and-hold circuits 120. Each sample-and-hold circuit 120 may include a hold capacitor 130 connected to the input switch 115, and a signal path amplifier 135, having an input connected to the hold capacitor 130. Voltage feedback, from each signal path amplifier 135 to a respective input switch 115, may reduce leakage from the hold capacitor 130 during a hold interval, as discussed in further detail below. Each of the sample-and-hold circuits 120 may also include an output switch 140; together, the output switches of the sample-and-hold circuits 120 may form an output multiplexer 145 connected to a common output node 150. The operation of the circuit of FIG. 1A may follow the timing diagram of FIG. 1C, as discussed in further detail below.

Figure 1B:
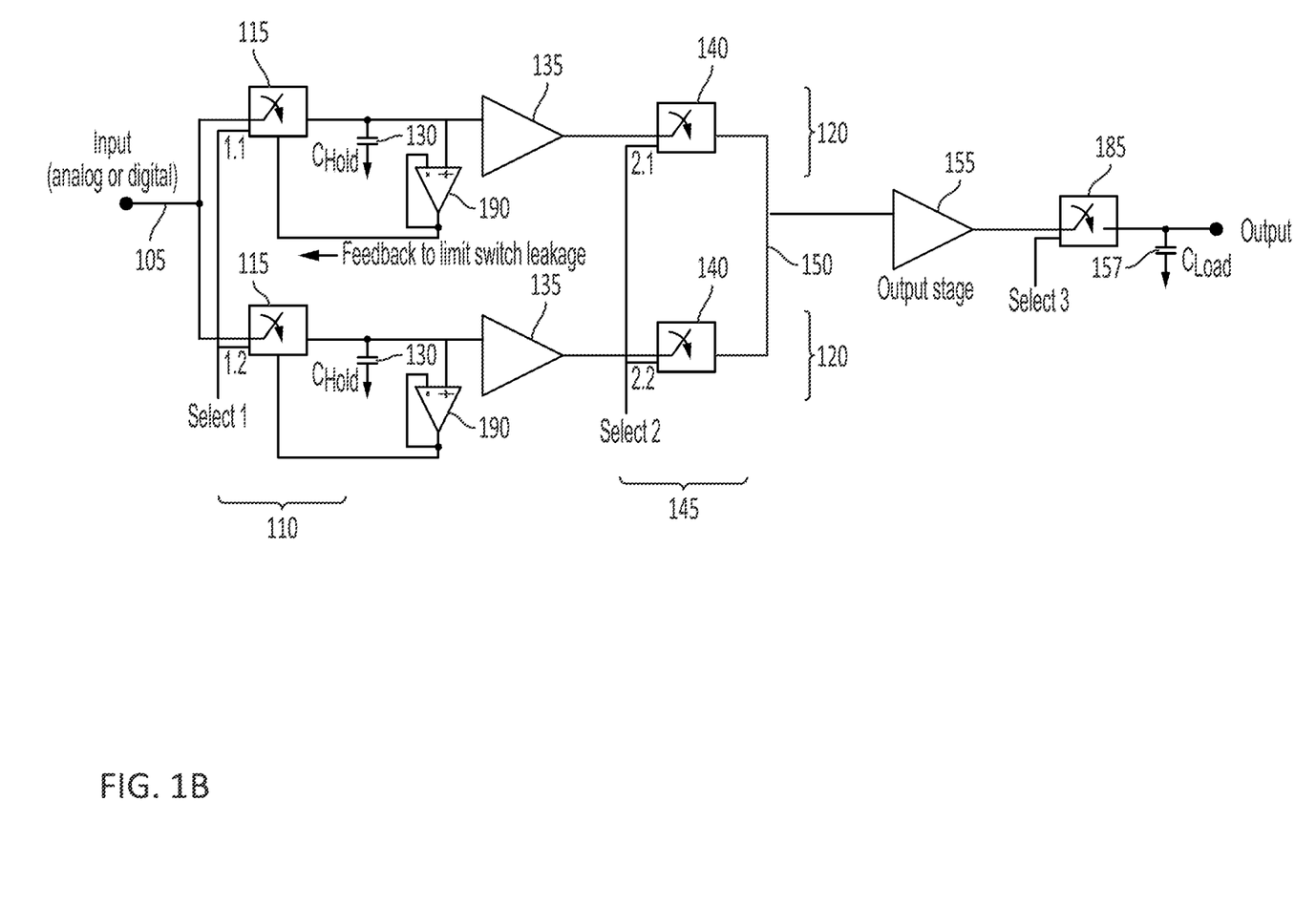
FIG. 1B is a schematic diagram of a portion of a signal processing circuit, according to an embodiment of the present disclosure.

FIG. 1B is a schematic diagram of a signal processing circuit, in some embodiments. The circuit of FIG. 1B is similar to that of FIG. 1A (and its operation may, like that of the circuit of FIG. 1A, follow the timing diagram of FIG. 1C). FIG. 1B differs from FIG. 1A in that voltage feedback to the input switches 115 (discussed in further detail below) is performed by respective switch feedback amplifiers 190 (instead of being performed by the signal path amplifiers 135). In either of the embodiments of FIGS. 1A and 1B, each amplifier providing voltage feedback to the input switch 115 may be a differential input amplifier. In one embodiment (FIG. 1A), the signal path and feedback amplifiers are the same. In a second embodiment (FIG. 1B), the signal path amplifier 135 and the switch feedback amplifier 190 are separate, and the signal path amplifier 135 may be a single-ended amplifier while the switch feedback amplifier 190 may be differential.

Each of the amplifiers shown in FIG. 1A (and in FIG. 1B) may include a local feedback circuit as shown. In the embodiment of FIG. 1A, stored data is selectable through paths buffered by the signal path amplifiers 135. Wider switch transistors may have lower resistance, noise, and settling time but they may also exhibit greater charge sharing. Adding signal path amplifiers 135 between the input switches 115 and the output switches 140 improves leakage and hold time, and decreases charge-sharing and crosstalk between operating switches.

In the embodiment of FIG. 1B, the signal path amplifier 135 may be a source follower. The use of a source follower instead of a differential amplifier makes it possible to buffer the signal with lower power, lower noise, and smaller footprint. In this case, another amplifier (the switch feedback amplifier 190) may be employed to feed the hold capacitor signal back to the switch since the source follower outputs a different voltage level than its input voltage. The switch feedback amplifier 190 is a unity-gain differential amplifier which is able to feed a same level of voltage back to the input switch. It may have lower power and bandwidth than if it is used for both feedback and for buffering the next stage. In the embodiment of FIG. 1B, the signal path amplifier is designed for low noise and high bandwidth but the feedback amplifier does not have as stringent requirements on noise, bandwidth, and drive capability. It can be simpler, smaller, and lower power. In this way, it is possible to optimize for low power, low noise, and chip size.

With the added isolation of the signal path amplifier 135, signals can be held for longer periods of time on the hold capacitor 130 with greater accuracy, and can be switched in and out to the load (e.g., a sensor load, as discussed in further detail below) through a separate output stage. The output stage amplifier may provide further advantages in optimizing the circuit operation. The circuits of FIG. 1A and FIG. 1B include a buffer (the signal path amplifier 135) between each input switch 115 and the corresponding output switch 140, unlike a related art circuit in which there is no buffering between switches and in which a low-leakage output switch is used because the hold capacitor is connected directly to the output. Even with this, a circuit in which there is no buffering between switches may exhibit a slower settling time and higher charge-sharing and crosstalk. In the circuits of FIG. 1A and FIG. 1B the buffers (the signal path amplifiers 135) in the signal path after the first bank of switches may increase channel isolation and decrease leakage, crosstalk, and random charge redistribution.

Figure 1C:
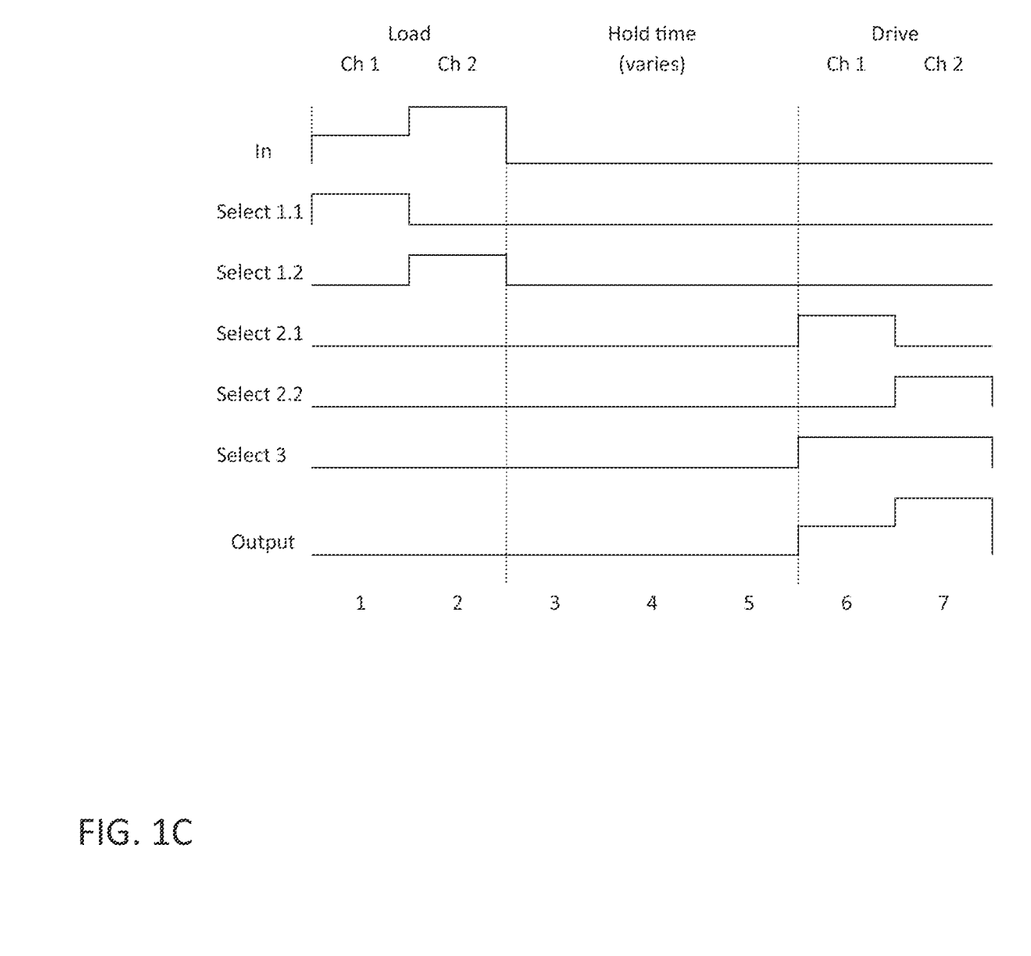
FIG. 1C is a timing diagram, according to an embodiment of the present disclosure.
Figure 1D:
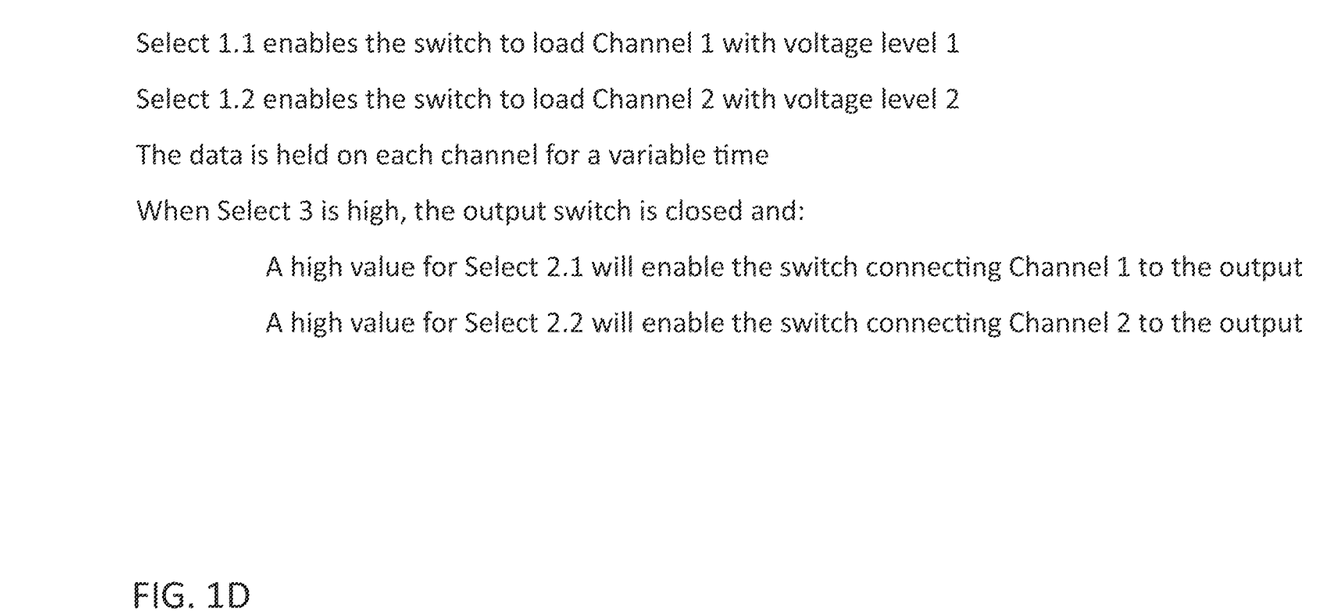
FIG. 1D is a table of explanatory notes for the timing diagram of FIG. 1C.

FIG. 1C shows a timing diagram, in some embodiments, and FIG. 1D is a table of explanatory notes for the timing diagram of FIG. 1C. In FIG. 1C, the value of each of seven signals (In, Select 1.1, Select 1.2, Select 2.1, Select 2.2, Select 3, and Output) is shown as a function of time, where time in "cycles" (each of which may correspond to a clock cycle of a system clock) is shown across the bottom of the timing diagram. In operation, the input switch 115 of the upper sample-and-hold circuit 120 in FIG. 1A (which may be referred to as the first sample-and-hold circuit 120), which is controlled by the Select 1.1 signal, may close, or "turn on" at the beginning of a load interval (which occurs during cycles 1 and 2), during which the sample-and-hold circuit 120 is in a load state. During cycle 1, as a result of the input switch 115 of the first sample-and-hold circuit 120 being turned on, the hold capacitor 130 of the first sample-and-hold circuit 120 is connected to the common input node 105. This hold capacitor 130 may then charge (or discharge) until the voltage on the hold capacitor 130 is equal to the voltage at the common input node 105.

During cycle 2, the input switch 115 of the first sample-and-hold circuit 120 is open and the input switch 115 of the lower sample-and-hold circuit 120 in FIG. 1A (which may be referred to as the second sample-and-hold circuit 120), which is controlled by the Select 1.2 signal, is closed. During cycle 2, as a result of the input switch 115 of the second sample-and-hold circuit 120 being turned on, the hold capacitor 130 of the second sample-and-hold circuit 120 is connected to the common input node 105. This hold capacitor 130 may then charge (or discharge) until the voltage on the hold capacitor 130 is equal to the voltage at the common input node 105.

Next, during a hold interval, or "hold time", the input switches 115 may be open, or "turned off", trapping the respective charges on the hold capacitors 130. In the example of FIG. 1C, the hold interval extends through cycles 3, 4, and 5. Next, during a drive interval (which occurs during cycles 6 and 7), the output switches 140 are turned on, one at a time. During cycle 6, the output switch 140 of the first sample-and-hold circuit 120 may be turned on, so that the voltage on the hold capacitor 130 of the first sample-and-hold circuit 120, buffered by the corresponding signal path amplifier 135, appears at the common output node 150.

An output stage (e.g., an amplifier) 155 may amplify the signal at the common output node 150 and the signal may then be delivered to a load, e.g., the signal may bias a sensor or feed a subsequent circuit stage such as an analog to digital converter, (either of which may have a capacitive input impedance, represented by the load capacitor 157). The signal path amplifier 135 may make it possible for the voltage on the hold capacitor 130 to drive the next stage without significantly disturbing the voltage on the hold capacitor 130. The presence of the signal path amplifier 135 in a sample-and-hold circuit 120 may also reduce cross-talk and loading between the sample-and-hold circuits 120 (which may also be referred to as sample-and-hold channels). During cycle 6, the output switch 140 of the first sample-and-hold circuit 120 may be turned on, and the output switch 140 of the second sample-and-hold circuit 120 may be turned off, so that the voltage on the hold capacitor 130 of the first sample-and-hold circuit 120, buffered by the corresponding signal path amplifier 135, appears at the common output node 150. During cycle 7, the output switch 140 of the first sample-and-hold circuit 120 may be turned off, and the output switch 140 of the second sample-and-hold circuit 120 may be turned on, so that the voltage on the hold capacitor 130 of the second sample-and-hold circuit 120, buffered by the corresponding signal path amplifier 135, appears at the common output node 150.

In some embodiments, the two sample-and-hold circuits 120 may operate in an interleaved fashion, with, e.g., the first sample-and-hold circuit 120 being in the sampling state (with the input switch 115 closed) while the second sample-and-hold circuit 120 is in the hold state (with the input switch 115 open), and vice versa. In this manner opportunities to sample the signal are not lost (as they may be, during the hold states, if a single sample-and-hold circuit 120 is used). In some embodiments, more than two sample-and-hold circuits 120 may be present, and, for example, instead of the outputs of the sample-and-hold circuits 120 being combined in the output multiplexer 145 as illustrated, the output of each sample-and-hold circuit 120 may drive multiple sensors or subsequent circuit stages. In some embodiments, a switch may be connected across the hold capacitor 130 to clear the charge from the hold capacitor 130 before transitioning to the sampling state. In other embodiments (such as that of FIGS. 1A and 1B), such a switch is not used and the circuit does not include a charge-clearing switch connected across the hold capacitor 130.

In some embodiments, the input switches 115 may be transmission gates, i.e., each such switch may be constructed from a p-channel field effect transistor (FET) (e.g., a p-channel metal oxide semiconductor field effect transistor (MOSFET)), and an n-channel field effect transistor (e.g., an n-channel MOSFET). A single traditional complementary transmission gate when used as a switch in sample and hold applications may however suffer from leakage. There may be two such sources of leakage current in such a sample and hold circuit: 1) drain-to-source off-state leakage, and 2) the P/N junction leakage currents associated with the source/drain diffusions.

Figures 2A, 2B:
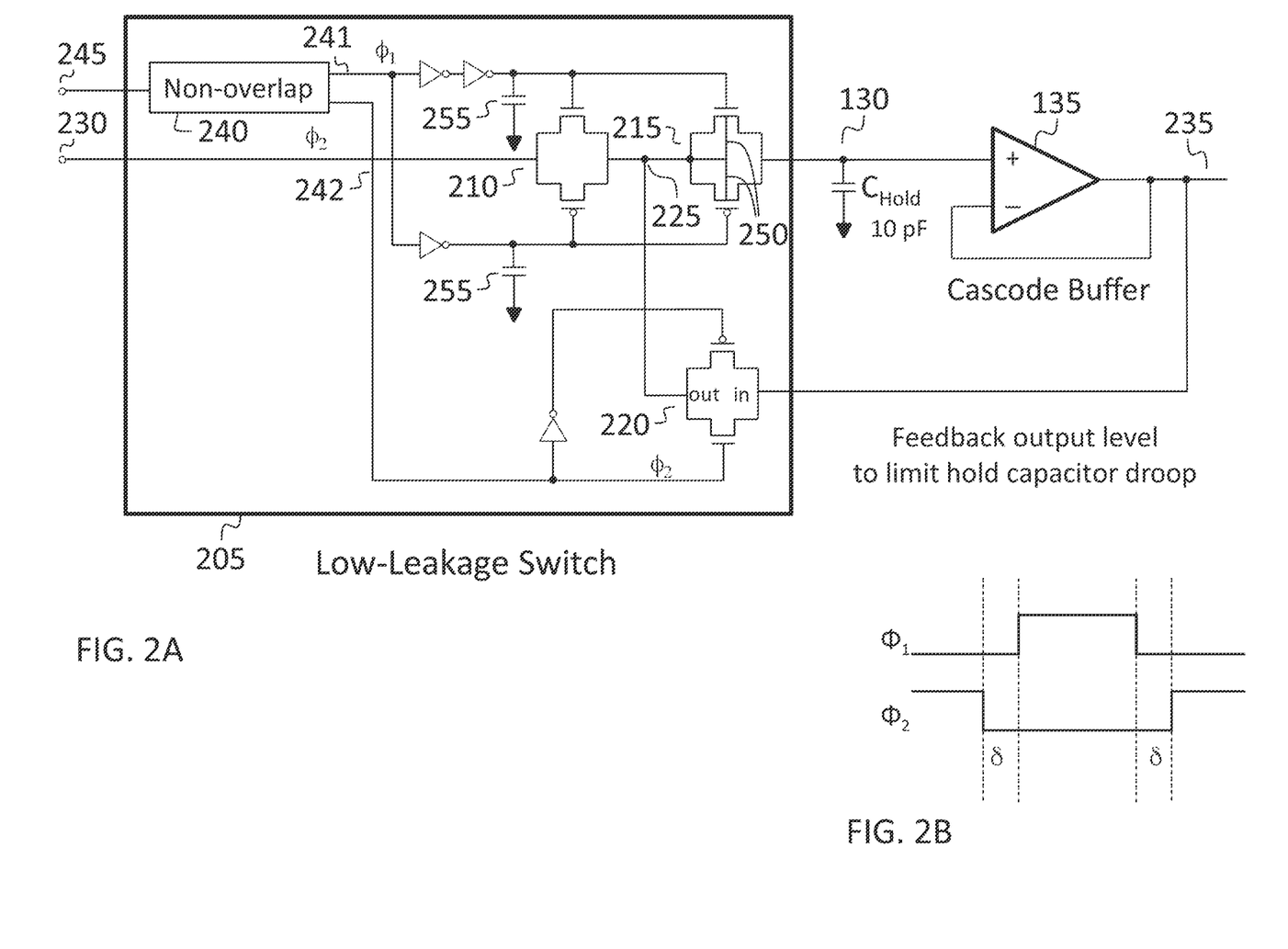
FIG. 2A is a schematic diagram of a portion of the circuit of FIG. 1A, according to an embodiment of the present disclosure.
FIG. 2B is a timing diagram, according to an embodiment of the present disclosure.

In some embodiments, each of the input switches 115 may be a low leakage switch 205 as illustrated in FIG. 2A. In such an embodiment, the magnitude of the total leakage current may be reduced, as discussed in further detail below, e.g., by doubling the transmission gates in a cascaded implementation (as illustrated in FIG. 2A). The low leakage switch 205 includes a first series switch 210, a second series switch 215, and a third switch, which may be referred to as a voltage feedback switch 220. Each of the first series switch 210, the second series switch 215, and the voltage feedback switch 220 may be implemented as a transmission gate, i.e., as a p-channel field effect transistor and an n-channel field effect transistor connected in parallel. The first series switch 210 and the second series switch 215 may be connected in series to form a series switch combination having a common node 225 (which may also be referred to as an "internal node" of the low leakage switch 205). This series switch combination may be connected between (i) an input 230 of the first sample and hold circuit and (ii) the hold capacitor 130. The input of the signal path amplifier 135 may be connected to the hold capacitor 130, and the output of the signal path amplifier 135 may be connected, through the voltage feedback switch 220, to the common node 225. In the embodiment of FIG. 2A, wider switch transistors may have lower resistance, noise, and settling time, but greater charge injection. Feedback from the output of the unity gain buffer (the signal path amplifier 135) is switched on during the hold cycle to maintain the hold capacitor voltage.

The low leakage switch 205 may further include a non-overlapping-clock circuit 240 connected to a clock input 245 of the low leakage switch 205. The nonoverlapping-clock circuit 240 may have an input 245 (for receiving a reference clock signal), a first clock output 241, and a second clock output 242. The clock signals produced at the first clock output 241 and a second clock output 242 may be "non-overlapping" in the sense that when these clock signals are employed to control the first series switch 210, the second series switch 215, and the voltage feedback switch 220 as illustrated in FIG. 2A, there may be, in operation, no overlap between any time interval during which the voltage feedback switch 220 is turned on and any time interval during which at least one of the first series switch 210 and the second series switch 215 is turned on. When the low leakage switch 205 is being turned on (e.g., at the beginning of cycle 2, for the low leakage switch 205 that is the input switch 115 of the second sample-and-hold circuit 120), a transition at the clock input 245 first triggers a falling edge at the second clock output 242. A short duration, δ, later, a rising edge appears at the other output, the first clock output 241, which is then buffered to turn on the first series switch 210 and the second series switch 215. Similarly, when the low leakage switch 205 is being turned off (e.g., at the end of cycle 2, for the low leakage switch 205 that is the input switch 115 of the second sample-and-hold circuit 120), a transition at the clock input 245 first triggers a falling edge at the first clock output 241, which is buffered to turn off the first series switch 210 and the second series switch 215; a short duration, δ, later, the nonoverlapping-clock circuit 240 produces a rising edge at the second clock output 242, to turn on the voltage feedback switch 220 with minimum disturbance to the hold capacitor 130. The voltage feedback switch 220 then connects the output of the signal path amplifier 135 (or, in the embodiment of FIG. 1B, the output of the switch feedback amplifier 190) to the common node 225.

For example, a first clock signal $\phi_1$ (produced by the nonoverlapping-clock circuit 240 at the first clock output 241) and a second clock signal $\phi_2$ (produced by the nonoverlapping-clock circuit 240 at the second clock output 242) may have the same frequency and the property that during each cycle the portion of the cycle during which the first clock signal $\phi_1$ is high is entirely overlapped by the (larger) portion of the cycle during which the second clock signal $\phi_2$ is low. FIG. 2B shows exemplary waveforms.

Figure 2C:
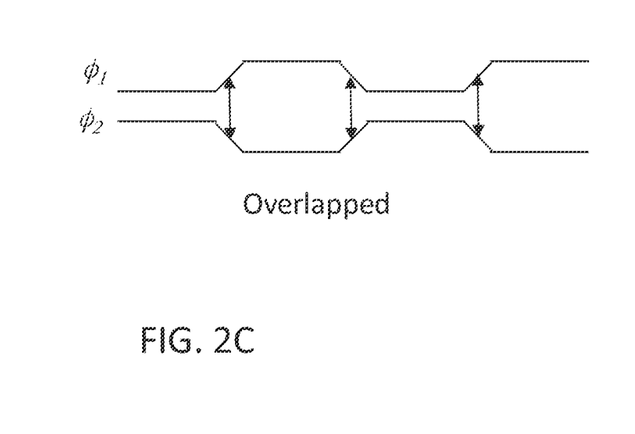
FIG. 2C is a timing diagram, according to an embodiment of the present disclosure.
Figure 2D:
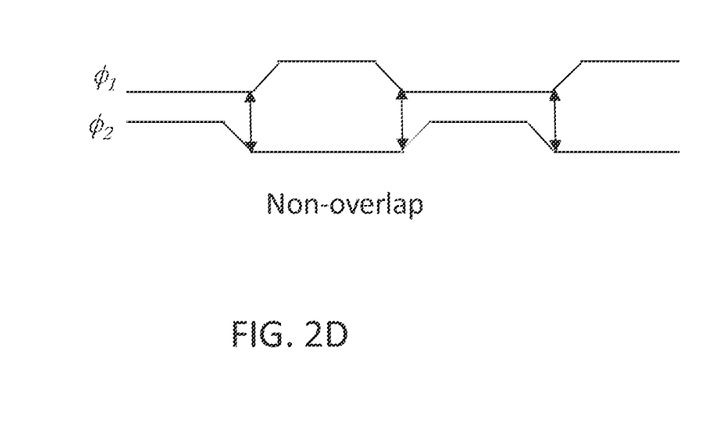
FIG. 2D is a timing diagram, according to an embodiment of the present disclosure.

FIGS. 2C and 2D show, for comparison, a conventional clock (FIG. 2C) and a non-overlap clock (FIG. 2D). In each of these drawings (unlike in the more idealized waveforms of FIG. 2B) a finite rise time and fall time is illustrated for each clock waveform. In FIG. 2D both clock waveforms have the same frequency and the property that during each cycle the portion of the cycle during which the first clock signal $\phi_1$ is high is entirely overlapped by the (larger) portion of the cycle during which the second clock signal $\phi_2$ is low. The arrows in FIG. 2C show the possibility that, for the conventional clock, both clocks may concurrently turn on the corresponding switches (e.g., the first series switch 210, the second series switch 215, and the voltage feedback switch 220) within the same time interval. The existence of such coincident intervals may result in charge redistribution, crosstalk or instability which may affect the final potential stored on the hold capacitor 130. The use of a nonoverlapping-clock circuit 240 may avoid such nonideal effects.

In the low leakage switch 205, the voltage feedback switch 220 may include a (i) p-channel field effect transistor, which may be connected through an odd number of inverters (e.g., through one inverter, as shown in FIG. 2A) to the second clock output 242 and (ii) an n-channel field effect transistor which may be connected without an inverter (or through an even number of inverters) to the second clock output 242. Each of the first series switch 210 and the second series switch 215 may include (i) an n-channel field effect transistor connected through an even number of inverters (e.g., through two inverters, as shown in FIG. 2A) to the first clock output 241, and (ii) a p-channel field effect transistor connected through an odd number of inverters (e.g., through one inverter, as shown in FIG. 2A) to the first clock output 241. Each inverter that drives a gate (or each inverter that drives a gate within the second series switch 215) may include a bandwidth-limiting circuit (e.g., a shunt capacitor 255, as shown), to reduce charge injection from the switches into the held potential. Each bandwidth-limiting circuit may limit the bandwidth of the inverter to which it is connected to a bandwidth between 10 MHz and 10 GHz.

At the end of the sampling (or "load") interval, the sample-and-hold circuit may transition from the sampling state to the hold state by first turning off, in response to a falling edge in the first clock signal $\phi_1$, the first series switch 210 and the second series switch 215, and then turning on, in response to a rising edge in the second clock signal $\phi_2$, the voltage feedback switch 220. As such, each of the two state transitions may include a time interval during which all three of the switches (the first series switch 210, the second series switch 215, and the voltage feedback switch 220) are turned off.

The voltage feedback switch 220 may hold the voltage across the second series switch 215 to a value near 0 V. There may be a small offset between the input and output of the signal path amplifier 135 due to its finite amplifier gain especially in low power designs. The offset presents a potential difference between the common node 225 and the voltage on the hold capacitor 130. However, that difference may be significantly smaller than in the case in which a single pass gate is used as the input switch 115. Further, not only the source and drain but also the substrate body, or "bulk" of the NFET and of the PFET in the second series switch 215 (each of which may be implemented with a triple-well CMOS process) may also be connected to the common node 225 (this may be accomplished using conductors 250 (e.g., metal traces) between the common node 225 and the substrate bodies of the NFET and PFET (which may be the p-well and n-well, respectively, in which those transistors are fabricated)). Reduced potential differences across any reverse biased P/N junction in the second series switch 215, and a corresponding reduction to this component of the leakage current, are thus achieved. Unlike a related art embodiment in which, (i) during hold, the n-well and p-well are connected to positive and negative power, and (ii) during the sampling (or "load") phase, they are disconnected, in the embodiment of FIG. 2A, it is not necessary to switch the connections back and forth between the wells. This may save power and switch timing and complexity.

In either case (whether (i) the output voltage of the signal path amplifier 135 is offset by a fixed, predictable voltage from the voltage on the hold capacitor 130, or (ii) the output voltage of the signal path amplifier 135 is equal to, or nearly equal to, the voltage on the hold capacitor 130), it may be the case that the leakage current modifying the charge on the capacitor in the hold state is smaller, and less dependent on the voltage on the common input node 105, than in the absence of the connection from the signal path amplifier 135 to the common node 225. This dependence may be quantified as the effective resistance of the low leakage switch 205. As used herein (as in related art), the "effective resistance" of a switch having an input terminal and an output terminal is the reciprocal of the rate of change of the leakage current at the output terminal with respect to the voltage at the input terminal (e.g., with respect to the voltage on the common input node 105, in the case of the low leakage switch 205).

In operation, in the hold state, the first series switch 210 and the second series switch 215 may both be turned off, and the voltage feedback switch 220 may be turned on. In this state, the signal path amplifier 135 may feed, to the common node 225, a voltage that is the same as, or nearly the same as, the voltage on the hold capacitor 130. In such an embodiment, the voltage across the second series switch 215 may be small or zero, so that little or no current may leak through the second series switch 215. This reduction in leakage through the second series switch 215 (compared to case in which the input switch 115 is a simple transmission gate) may significantly improve (i) the stability of the voltage on the hold capacitor 130 and, accordingly, (ii) the accuracy of the signal applied (i) to a bias input of a sensor or (ii) to other subsequent circuitry that may be connected to the sample-and-hold circuit. The low leakage switch 205 may be referred to herein as a "low leakage switch" even though its low leakage characteristics may be due in part to the presence of the signal path amplifier 135. In some embodiments, the signal path amplifier 135 may be a source follower, or "common drain" amplifier; in other embodiments, it may be a cascode amplifier, or any other suitable amplifier. The output stage 155 may be implemented with a source follower, or a cascode amplifier, or any other suitable amplifier.

In an embodiment in which the input switch 115 is a low leakage switch 205 with an internal node connected to a signal path amplifier 135 as in the embodiment of FIG. 2A, any voltage change on the common input node 105 may be attenuated by the voltage divider formed by (i) the off resistance of the first series switch 210 and (ii) the series combination of the output impedance of the signal path amplifier 135 and the on-state resistance of the voltage feedback switch 220. In this case, the effective resistance of the low leakage switch 205 may be the product of (i) one plus the ratio of (a) the off resistance of the first series switch 210 to (b) the sum of the output impedance of the signal path amplifier 135 and the on-state resistance of the voltage feedback switch 220 and (ii) the off state resistance of the second series switch 215. In some embodiments, the amount by which the connection from the signal path amplifier 135 to the common node 225 increases the effective resistance (i.e., one plus the ratio of (a) the off resistance of the first series switch 210 to (b) the sum of the output impedance of the signal path amplifier 135 and the on-state resistance of the voltage feedback switch 220) is between 10 and 1,000,000, or it is greater than 100, and the off state resistance of the second series switch 215 is between 100 ohms and 1 MΩ. In some embodiments, the effective resistance of the input switch 115 is greater than 100,000 ohms, or it is between 10,000 ohms and 1,000,000,000 ohms.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, the word "or" is inclusive, so that, for example, "A or B" means any one of (i) A, (ii) B, and (iii) A and B. As used herein, when a second number is "within Y %" of a first number, it means that the second number is at least $(1-Y/100)$ times the first number and the second number is at most $(1+Y/100)$ times the first number.

It will be understood that when a first element is referred to as being "directly connected" or "directly coupled" to a second element, there are no intervening elements present. As used herein, when a first element is referred to as being "generally connected" to a second element, it means that the first element and the second element are connected by an electrical path that may contain arbitrary intervening elements (e.g., intervening elements connected between the first element and the second element), including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit. When a first element is referred to as being "operatively coupled" to a second element, it means that (i) in operation, the first element receives a signal from the second element (possibly through intervening elements, (which may or may not qualitatively modify the signal) or (ii) in operation, the second element receives a signal from the first element (possibly through intervening elements, which may or may not qualitatively modify the signal).

A "transistor" as used herein is an element with two power terminals (e.g., the source and drain, or the emitter and collector) and a control terminal (e.g., the gate or the base). When the connections of a transistor are described as though the transistor were a two-terminal device (e.g., "two transistors connected in parallel") the connections described are connections to the power terminals (e.g., the source and the drain, or the emitter and the collector). Unless the context indicates otherwise (the phrase "an SPDT switch" being an example of a phrase in which the context indicates otherwise), a "switch" is a two-terminal device configured to operate in two states, an "open" state, in which the impedance between the two terminals is high, and a "closed" state in which the impedance between the two terminals is low. As such, a transistor switch that is turned on (or simply "on") may be said to be "closed" and a transistor switch that is turned off (or simply "off") may be said to be "open". When two transistors are connected such that, when both transistors are turned on, current will flow through them in series, the node at which the transistors are connected together may be referred to as the "common node", the transistors may be said to be "connected in series", and the two ends of the channels that are not at the common node are the "ends" of the series combination.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although exemplary embodiments of a multiplexing sample-and-hold circuit have been specifically described and illustrated herein, many modifications and variations will be apparent to those skilled in the art. Accordingly, it is to be understood that a multiplexing sample-and-hold circuit constructed according to principles of this disclosure may be embodied other than as specifically described herein. The invention is also defined in the following claims, and equivalents thereof.

What is claimed is:

1. A signal processing circuit, comprising:
a first sample and hold circuit; and
a second sample and hold circuit,
the first sample and hold circuit comprising:
   a hold capacitor;
   an input switch connected between a common input node and the hold capacitor;
   a signal path amplifier having an input connected to the hold capacitor; and
   an output switch connected between an output of the signal path amplifier and a common output node,
an input of a voltage feedback amplifier being connected to the hold capacitor, and
an output of the voltage feedback amplifier being operatively coupled to an internal node of the input switch,
wherein the input switch comprises:
   a first series switch;
   a second series switch; and
   a voltage feedback switch,
   the first series switch being connected between the common input node and the internal node,
   the second series switch being connected between the internal node and the hold capacitor, and
   the voltage feedback switch being connected between the output of the voltage feedback amplifier and the internal node, and
a clock circuit having an input, a first output and a second output, the clock circuit being configured to receive a reference clock signal and to produce:
   at the first output, a first clock signal having the same frequency as the reference clock signal,
   at the second output, a second clock signal having the same frequency as the reference clock signal,
the first output being operatively coupled to one or more control terminals of the first series switch and of the second series switch, and
the second output being operatively coupled to the voltage feedback switch.

2. The signal processing circuit of claim 1, wherein the voltage feedback amplifier is the signal path amplifier.

3. The signal processing circuit of claim 1, wherein the voltage feedback amplifier is a switch feedback amplifier, separate from the signal path amplifier.

4. The signal processing circuit of claim 1, wherein the operative coupling of the voltage feedback amplifier and the internal node of the input switch is configured to increase the effective resistance of the input switch by a factor of at least 100.

5. The signal processing circuit of claim 1, wherein the effective resistance of the input switch is greater than 100,000 ohms.

6. The signal processing circuit of claim 1, wherein the first series switch comprises a first transistor connected in parallel with a second transistor.

7. The signal processing circuit of claim 6, wherein the first transistor is an n-channel field effect transistor, and the second transistor is a p-channel field effect transistor.

8. The signal processing circuit of claim 6, wherein the second series switch comprises an n-channel field effect transistor connected in parallel with a p-channel field effect transistor.

9. The signal processing circuit of claim 1, wherein the clock circuit is configured to cause, in order:
the first series switch and the second series switch to open;
the voltage feedback switch to close;
the voltage feedback switch to open; and the first series switch and the second series switch to close.

10. The signal processing circuit of claim 1, wherein:
the first series switch comprises a first field effect transistor connected in parallel with a second field effect transistor;
the second series switch comprises a first field effect transistor connected in parallel with a second field effect transistor; and
the first output of the clock circuit is connected:
through a first inverter and a second inverter, connected in cascade, to:
the gate of the first field effect transistor of the first series switch, and
the gate of the first field effect transistor of the second series switch; and
through a third inverter to:
the gate of the second field effect transistor of the first series switch, and
the gate of the second field effect transistor of the second series switch.

11. The signal processing circuit of claim 10, wherein each of the second inverter and the third inverter is connected to a respective bandwidth-limiting circuit.

12. The signal processing circuit of claim 11, wherein each of the bandwidth-limiting circuits limits the bandwidth of a corresponding inverter to a respective bandwidth, each of the respective bandwidths being less than 10 GHz or less than a frequency of a system clock signal.

13. The signal processing circuit of claim 12, wherein:
the voltage feedback switch comprises a first field effect transistor connected in parallel with a second field effect transistor; and
the second output of the clock circuit is connected:
to the gate of the first field effect transistor of the voltage feedback switch, and
through one inverter, to the gate of the second field effect transistor of the voltage feedback switch.

14. The signal processing circuit of claim 1, wherein:
the second sample and hold circuit comprises:
a hold capacitor,
an input switch connected between the common input node and the hold capacitor of the second sample and hold circuit,
a signal path amplifier having an input connected to the hold capacitor of the second sample and hold circuit,
an output switch connected between an output of the signal path amplifier of the second sample and hold circuit and the common output node; and
the output of the signal path amplifier of the second sample and hold circuit is operatively coupled to an internal node of the input switch of the second sample and hold circuit.

15. The signal processing circuit of claim 1, wherein the signal path amplifier comprises a source follower amplifier.

16. The signal processing circuit of claim 1, wherein the signal path amplifier comprises a differential amplifier.

17. The signal processing circuit of claim 1, further comprising an output stage, having an input connected to the common output node.

18. The signal processing circuit of claim 17, wherein the output stage comprises a source follower amplifier.

19. The signal processing circuit of claim 17, wherein the output stage comprises a differential amplifier.

* * * * *